United States Patent [19]

Gervay

[11] Patent Number: 4,621,043

[45] Date of Patent: Nov. 4, 1986

[54] STORAGE STABLE PHOTOPOLYMERIZABLE COMPOSITION

[75] Inventor: Joseph E. Gervay, Red Bank, N.J.

[73] Assignee: E. I. Du Pont de Nemours and Company, Wilmington, Del.

[21] Appl. No.: 462,403

[22] Filed: Jan. 31, 1983

[51] Int. Cl.[4] .............................................. G03C 1/68
[52] U.S. Cl. ..................................... 430/281; 430/910
[58] Field of Search ................................. 430/281, 910

[56] References Cited

U.S. PATENT DOCUMENTS

| | | | |
|---|---|---|---|
| 3,804,735 | 4/1974 | Radlove et al. | 204/159.23 |
| 3,887,450 | 6/1975 | Gilano et al. | 430/910 |
| 3,989,610 | 11/1976 | Tsukada et al. | 204/159.15 |
| 4,025,348 | 5/1977 | Tsukada et al. | 96/115 R |
| 4,169,732 | 10/1979 | Shipley | 96/35.1 |
| 4,171,977 | 10/1979 | Hasegawa et al. | 96/115 P |
| 4,234,675 | 11/1980 | Kuznetsov | 430/910 |
| 4,239,849 | 12/1980 | Lipson et al. | 430/910 |
| 4,247,621 | 1/1981 | Sano et al. | 430/269 |
| 4,250,248 | 2/1981 | Faust | 430/284 |
| 4,273,857 | 6/1981 | Leberzammer et al. | 430/910 |
| 4,284,707 | 8/1981 | Nagasawa et al. | 430/910 |
| 4,320,189 | 3/1982 | Taguchi et al. | 430/288 |

Primary Examiner—Jack P. Brammer

[57] ABSTRACT

A storage stable photopolymerizable composition is disclosed comprising polymeric acid binder with an acid number of at least 45 and a pKa value of at least 5, monomer, photoinitiator and an aldehyde resin precursor.

15 Claims, No Drawings

STORAGE STABLE PHOTOPOLYMERIZABLE COMPOSITION

BACKGROUND OF THE INVENTION

The present invention is in the field of photopolymerizable compositions useful as photoresists. In particular the invention deals with a laminated photopolymer composition with improved physical properties.

Photopolymerizable resist materials are known from U.S. Pat. No. 3,469,982 which describes a film resist in the form of a photopolymerizable layer sandwiched between a cover sheet and a temporary support. This film resist may be laminated to copper or copper-laminated board, exposed and processed to provide a photopolymerized layer which acts as a resist for subsequent etching.

A subsequent disclosure of manufacture of printed circuit boards using a laminated photosensitive layer is U.S. Pat. No. 3,547,730 which discloses the laminated layer achieving sufficient adhesion to the substrate to withstand subsequent photoresist processing steps of development, etching and plating.

Photoresists are well known in the art, and are commercially available under tradenames such as Riston ® and Vacrel ®. Photoresists typically comprise a cover sheet and a photopolymerizable layer which contains binder, monomer and photoinitiator. After the photopolymerizable layer is laminated to a substrate and exposed imagewise, the cover sheet can be removed and the layer is developed to produce an image. Some photoresist compositions are solvent developable and some are aqueous developable. The developed photopolymerized image serves to allow selective etching or soldering of the substrate.

A particularly demanding role for a photoresist film exists when it is used as a solder mask. The developed photopolymerized composition must be capable of resisting temperature of 300° C.

The prior art teaches that solder masks may be prepared by coating, spraying or printing liquid compositions containing epoxy onto the substrate as in U.S. Pat. Nos. 4,237,216; 4,205,018; 4,171,977; 4,090,936 and 4,064,287. A method for preparing a film which can be laminated to a substrate is described in U.S. Pat. No. 4,029,348 which describes incorporation of an epoxy resin in a photopolymer layer along with a latent curing agent such as a boron trifluoride amine complex.

In U.S. Pat. No. 4,320,189 S-triazine compounds are disclosed for improving adhesion in photoresist lamination.

Thermal curing of the combination of an acid and a melamine compound is known as a means of obtaining superior mechanical properties in a coated film. In particular melamine compounds in combination with an acid functional unsaturated condensation binder and an ethylenically unsaturated compound are known from U.S. Pat. No. 4,247,621 for improving the mechanical strength of a photosensitive resin composition. This publication teaches that the binder comprise at least 50% unsaturated acid and have an acid value of 10 to 40. It is stated that unsatisfactory results are obtained with acid values below 10 or above 40. This publication further teaches that in addition to the acid functionality of the polyester that an optional acid such as p-toluene sulfonic acid can be added to accelerate the heat-hardening of the three essential components, i.e., (A) unsaturated polyester (B) photopolymerizable ethylenically unsaturated compound (C) melamine compound. The unsaturated polyester contains only terminal carboxylic groups to undergo crosslinking. The practice of this technique requires the balance of the amounts of (A), (B) and (C) to regulate viscosity and mechanical strength. This reference contains no suggestion of a means for producing a storage stable photoresist with a binder of higher acid value which can be laminated to a substrate.

An object of the present invention is to provide a photoresist film which is both highly stable at room temperature yet thermally curable at modest temperatures to improve physical properties.

A particular object of the present invention is to provide a solder mask element with improved hydrolytic stability.

SUMMARY OF THE INVENTION

The present invention is directed to a photopolymerizable. storage stable composition comprising polymeric acid binder, monomer and photoinitiator with said composition containing an aldehyde condensation resin precursor whereby said precursor forms a crosslinkable aldehyde condensation resin in the presence of the acid binder which has an acid number of at least 45 and a pKa value of at least 5 whereby said photopolymerizable composition can be laminated to a support and held for two weeks at 40° C. without any substantial amount of crosslinking, said pKa value measured in a 1:1 volume ratio of methanol to water.

DETAILED DESCRIPTION OF THE INVENTION

The present invention incorporates an aldehyde condensation resin precursor in a photopolymerizable composition containing polymeric acid binder, monomer and photoinitiator.

In the present context an aldehyde condensation resin precursor is a component which forms an aldehyde resin in the presence of an acidic binder having an acid number of at least 45 and a pKa value not greater than 5 (measured in 1:1 volume ratio of methanol to water) when heated to a temperature of 150° C. for 60 minutes. However the photopolymerizable composition is storage stable and can be held for 40° C. for two weeks either before or after lamination without any substantial amount of crosslinking. Preferably, the composition is storage stable for four weeks. A substantial amount of crosslinking in storage would render the composition unsuitable for use as a photoresist film.

The acidic binder is generally insoluble in water and the pKa value is measured in a 1:1 volume ratio of methanol to water. A suitable procedure involves measurement of a 0.5 g sample of the material being measured, i.e., the acid binder, dissolved in 50 ml of a 1:1 volume ratio of methanol to water. The dissolved sample can be titrated on an automatic potentiograph such as a Metron Model E 436 using 0.1N sodium hydroxide and a glass indicator electrode and a silver chloride reference electrode. The pKa value is taken as the midpoint of a neutralization curve on a graph produced by the titration.

Generally the aldehyde condensation resin precursor in the presence of an acid binder having an acid number of at least 45 and a pKa value of at least 5 measured in 1:1 volume ratio of methanol to water will not react in a short time period to form the crosslinkable aldehyde resin at a temperature significantly lower than 120° C.

Since a thermal cure is necessary for the reaction to proceed, extended storage time can be obtained for the photosensitive composition conventionally present as a film. In addition it is possible to laminate the film to a support at a temperature of 120° C. or lower without initiating the thermal cure reaction between the acid binder and the aldehyde condensation resin precursor.

Suitable examples of aldehyde condensation resin precursors are are melamines, ureas and benzoguanamines.

Aldehyde condensation resin precursors suitable for the practice of the present invention may comprise from 1 to 20 weight percent of the photoresist composition. A single precursor compound or a combination of compounds may be used. A preferred choice is hexamethoxymethylmelamine. The preferred amount of precursor in a photoresist is 3 to 15 wt. %.

An additional necessary component in the photopolymerizable composition is an acidic binder with an acid number of at least 45 and a pKa value of at least 5 measured in 1:1 volume ratio of methanol to water. Preferably, the acid number will be at least 55 with a preferred range from 55 to 130. A more preferred range for acid number is from 60 to 100. The pKa value is preferably at least 5.5 with a preferred range from 5.5 to 7.5. A more preferred range is from 5.9 to 7.2. A binder is a conventional and necessary component in a photopolymerizable composition. The function of the acid binder is to form a crosslinked network with the aldehyde resin produced from its precursor at elevated temperatures. The acid binder conventionally includes pendant carboxylic acid groups as opposed to only terminal carboxylic acid groups.

Acid binders suitable for the practice of the present invention are described in German Pat. No. 2,123,782; U.S. Pat. Nos. 4,273,857; 3,458,311; and U.K. Pat. No. 1,507,704. Polyacrylates comprise a particularly useful class of acid binders. Among those commercially available are Carboset ® acrylic acid polymers such as Carboset ®525, 526 as well as XL27.

In addition to the necessary acid binder the composition may include useful amphoteric polymers such as interpolymers derived from N-alkylacrylamides or methacrylamides, acidic film-forming comonomer and an alkyl or hydroxyalkyl acrylate such as those disclosed in U.S. Pat. No. 3,927,199.

The amount of acid binder is not critical provided it is present in an amount sufficient to allow formation of the aldehyde resin and a crosslinked polymer network at elevated temperature. Conventionally the amount of binder will be determined by the quantity necessary for the proper balance of properties in a photosensitive composition containing the necessary components of binder, monomer and photoinitiator. Sufficient acid functionality was found in a film containing 25% acid binder with 75% neutral binder.

Conventionally the binder is the most significant component of the photoresist film in terms of what physical properties the film or laminate will have while being used in a photoresist process. The binder serves as a containing medium for the monomer and photoinitiator prior to exposure, but after exposure the unexposed portions must be capable of being washed away. Cohesion, adhesion, flexibility, miscibility and tensile strength are some of the many properties which determine if the binder is suitable for its various functions in the photoresist process.

Acid binders are known in the prior art in both solvent and aqueous developable photoresist compositions. In aqueous developable films the acid binder may be a major component. An unexpected result with use of an aldehyde resin precursor is that an acid binder can function as a critical component in formation of the aldehyde resin and the crosslinked polymer network. A binder with a pKa below 5 is not used because instability and crosslinking problems are introduced on aging. A large degree of crosslinking makes the film unsuitable. A binder with an acid number below 45 is not sufficiently reactive for the purposes of the present invention. This is probably due to an insufficient number of acid sites to enable formation of a strong crosslinked polymer network.

Additional binder additives which enhance the physical performance of the photoresist film without adversely affecting the thermal cure reaction of the acid binder and aldehyde condensation resin precursors are polyurethane and polyvinyl pyrrolidone or copolymers comprising a majority proportion of either polymer.

The photopolymer resist composition is prepared from polymeric components (binders), monomeric components, initiators and optionally inhibitors. The acid binder and aldehyde condensation resin precursor photoresist composition together with the remaining necessary components of a photopolymerizable composition can be coated on a support and dried to produce a stable photoresist film. This film can be laminated to a substrate at temperatures of up to 120° C. without adversely affecting the thermal curing capability of the incorporated acid binder and aldehyde condensation resin precursor. The photosensitivity and cover sheet separation of the photoresist film are not adversely affected by the precursor. However, when the laminated photoresist film of the present invention is subjected to a temperature of 120 to 150° C. for 15 minutes or longer an internal crosslinking occurs to strengthen the physical properties of the laminated film.

Suitable binders which can be used include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl choride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose esters, e.g., methyl cellulose, ethyl cellulose and benzyl cellulose; polycarbonates; polyvinyl acetal, e.g., polyvinyl butyral, polyvinyl formal; polyformaldehydes.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, trimethylol-propane ethoxylate triacrylate pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers with hydrogen donors, and mixtures thereof as described in U.S. Pat. Nos. 3,427,161; 3,479,185; and 3,549,367 can be used as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in U.S. Pat. No. 4,168,982.

Various dyes and pigments may be added to increase the visibility of the resist image. Any colorant used, however, should preferably be transparent to the actinic radiation used.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing filler. Thermosetting resins with reinforcing fillers are ordinarily used for rigid boards, whereas thermoplastic resin without reinforcements are usually used for flexible circuit boards.

Typical board construction involves combinations such as phenolic or epoxy resins on paper or a paper-glass composite, as well as polyester, epoxy, polyimide, polytetrafluoroethylene, or polystyrene on glass. In most instances, the board is clad with a thin layer of electroconductive metal of which copper is by far the most common.

It will be recognized by those skilled in the art that it will be preferable for the printed circuit substrate surface which is to be laminated to be clean and free of any extraneous material which might render any significant amount of the surface nonwettable. For this reason, it will frequently be desired to clean printed circuit substrates prior to lamination by one or more of the several cleaning processes which are well-known in the field of printed circuit board manufacture. The particular type of cleaning depends upon the type of contamination—organic, particulate or metallic. Such methods include degreasing with solvents and solvent emulsions, mechanical scrubbing, alkaline soaks, acidification and the like, followed by rinsing and drying.

In the practice of the present invention, a variety of supports may be used for the resist element. A suitable support having a high degree of dimensional stability to temperature changes may be chosen from a wide variety of films composed of high polymers, e.g., polyamides, polyolefins, polyesters, vinyl polymers, and cellulose esters. A preferred support for the present invention is polyethylene terephthalate.

Suitable protective cover sheets may be chosen from the same group of polymer films listed as supports. Polyethylene and polyethylene terephthalate are particularly useful as cover sheets for resist elements of the present invention.

The invention will be more clearly understood by reference to the following examples. All parts and percentages are by weight unless otherwise indicated.

EXAMPLE 1

A coating composition was prepared as follows:

| | |
|---|---|
| Methylene chloride | 300 g |
| Methanol | 30 g |
| Pentaerythritol triacrylate | 35 g |
| Hexamethoxymethylmelamine | 10 g |
| Diethylhydroxylamine | 0.05 g |
| Benzophenone | 4 g |
| Michler's ketone | 0.1 g |
| 5-Amino-1,3,4-thiadizole-2-thiol | 0.2 g |
| Carboset ® 525 (methylmethacrylate/-ethyl acrylate/acrylic acid copolymer from B. F. Goodrich Acid No. 76–85; M.W. 260,000 | 43.7 g |
| HVT-45 Green Pigment | 3 g |
| Polyvinylpyrrolidone | 4 g |

After being well stirred the composition was coated on a polyethylene terephthalate support using a doctor knife to give a coating of 0.01 mm thickness.

Samples of these coatings were then laminated on epoxy panels with tin/lead on copper circuitry using a roll laminator at a temperature of 107° C.

A laminated sample was stored at 40° C. for two weeks. When tested in comparison with freshly prepared and laminated samples prepared with and without melamine there was no indication of premature reaction between the melamine and acid binder. This illustrates the storage stability of the present invention.

A one minute ultraviolet exposure of the boards used, as a radiation source, a Riston ® PC Printer Model B24, available from Du Pont Photo Products, Wilmington, Del.

Following exposure the polyethylene terephthalate support film was peeled off and discarded and the boards were developed by placing it in a spray of 1% $Na_2CO_3$ at 90° F., at 30 lbs/in$^2$ at a distance of six inches from the spray nozzles.

Two boards were then placed in an oven at 149° C. for one hour to allow thermal curing. The other boards were thermally cured by passing through an infrared oven at a rate of 8.5 cm/min at a setting of 80 volts using a model PC4015 Infrared reflow unit available from Argus International.

The thermally cured boards were then passed through wave solder at 24 cm/min at a temperature of 282° C. or immersed in molten solder for 5 seconds two times using aqueous alcohol based flux Alpha 709 available from Alpha Chemicals.

Excellent results were obtained for all samples.

In comparison samples of the same formulation, but without hexamethoxymethylmelamine, did not survive the solder treatment. Also samples prepared according to the present invention showed no deterioration when stored for seven days at 95° C. at 95% RH.

EXAMPLE 2

A coating composition was prepared as follows:

| | |
|---|---|
| Methylene chloride | 300 g |
| Methanol | 30 g |
| Trimethylolpropanetriacrylate | 35 g |
| Hexamethoxymethylmelamine | 10 g |
| Diethylhydroxylamine | 0.05 g |
| Benzophenone | 4 g |
| Michler's ketone | 0.1 g |
| 5-Amino-1,3,4-thiadiazole-2-thiol | 0.2 g |
| Carboset ® 525 (methylmethacrylate/-ethyl acrylate/acrylic acid copolymer from B. F. Goodrich Acid No. 76–85; M.W. 260,000 | 38.5 g |
| HVT-45 Green Pigment | 3 g |
| Estane ® 5712 (Polyester based polyurethane available from Goodrich) | 10 g |
| Polyvinylpyrrolidone | 4 g |

Samples were prepared and tested as in Example 1. Comparison samples containing everything except hexamethoxymethylmelamine again did not survive the solder tests while the samples with hexamethoxymethylmelamine did as in Example 1.

Samples were also tested for thermal shock by being subjected to a 100 cycles of temperature change from −65° C. to +125° C. Samples containing polyurethane survived this test without cracking, whereas comparison samples containing all other ingredients except polyurethane showed severe cracking.

EXAMPLE 3

A coating composition was prepared as follows:

| | |
|---|---|
| Celrad 3700 (Epoxy-acrylated monomer) from Celanese | 10 g |
| Blendex 491 (ABS resin from Borg Warner) | 20.5 g |
| Monazoline CY (1-hydroxyethyl-2-alkylimidazoline) | 2 g |
| Pentaerythritol triacrylate | 25 g |
| Carboset ® 525 (methylmethacrylate/-ethyl acrylate/acrylic acid copolymer from B. F. Goodrich Acid No. 76–85; M.W. 260,000 | 24 g |
| Benzophenone | 6 g |
| Michler's ketone | 0.5 g |
| Monastral Green Pigment | 0.18 g |
| Hexamethoxymethylmelamine | 15 g |
| 3-Mercapto-1H—1,2,4-triazole | 0.3 g |

A 35% solids solution was prepared in methylene chloride and coated as in Example 1. Samples were laminated to boards and exposed as in Example 1. Following exposure the polyethylene terephthalate support film was peeled off and discarded and the boards were developed in a bath of 1,1,1 trichloroethane.

Boards were then oven cured and wave soldered as in Example 1. Excellent results were obtained.

In comparison samples of the same formulations, but without hexamethoxymethyl melamine, did not survive the solder treatment.

This example illustrates that the present invention is applicable to solvent developable as well as aqueous developable film resists.

EXAMPLE 4

A coating composition was prepared as in Example 1 except that different acid binders were substituted in place of Carboset ®525. The compositions were tested as in Example 1 to determine which acid binder-melamine combinations demonstrated storage stability for two weeks and which could survive wave solder or molten solder treatment. Table 1 contains comparative results with Example 1 using Carboset ®525.

TABLE 1

| Polymeric Acid Binder | Acid Number | pKa | Stable for 2 weeks | Survive Solder |
|---|---|---|---|---|
| Scripset ® 540 styrene/maleic anyhydride | 185 | 3.9 | Not insolubilized in 3 days | yes, but only useful if used shortly after being coated |
| XL-50 Methylmethacrylate ethyl acrylate/ acrylic acid copolymer by B. F. Goodrich | 197 | 6.2 | yes | yes |
| XL-51 Methylmethacrylate ethyl acrylate/ acrylic acid copolymer by B. F. Goodrich | 197 | 6.5 | yes | yes |
| Methyl methylacrylate/ methacrylic acid | 135 | 7.2 | yes | yes |
| SMA 3840 from Arco styrene/maleic anhydride | 105 | — | yes | yes |
| Carboset ® 525 | 80 | 5.9 | yes | yes |
| Methylmethacrylate methacrylic acid 92/8 | 60 | — | yes | yes |
| Gelva C-5/V-10 vinyl acetate/ crotonic acid 5% | 39 | 5.9 | yes | no |
| Vinac ASB 516 vinyl acetate/ crotonic acid 5% | 35 | — | yes | no |
| Vinac ASB 310 vinyl acetate/ crotonic acid 3% | 23 | — | yes | no |
| Elvacite 2008 methylmethacrylate/ methacrylic acid | 9 | — | yes | no |

Thus both storage stable and solder resistant compositions would have binders with an acid number at least 45 and a pKa at least 5.

EXAMPLE 5

Coating compositions were prepared as in Example 1 except that hexamethoxymethyl melamine was eliminated and other aldehhyde resin precursors were used in the same amount. Following the coating and testing procedures of Example 1, it was found that satisfactory thermal curing was obtained with urea and benzoguanamine.

EXAMPLE 6

A coating composition was prepared as follows:

| | |
|---|---|
| Methylene chloride | 300 g |
| Methanol | 30 g |
| Carboset ® 525 (methylmethacrylate/-ethyl acrylate/acrylic acid copolymer from B. F. Goodrich Acid No. 76-85; M.W. 260,000 | 33.6 g |
| Amphoteric Interpolymer formed from 40% N—t-octyl acrylamide, 34% methyl methacrylate, 16% acrylic acid, 6% hydroxy propyl methacrylate and 4% t-butyl amino ethyl methacrylate: mol. wt. ca. 50,000 | 5 g |
| Estane ® 5712 (Polyester base available from Goodrich) | 7.5 g |
| Hexamethoxymethylmelamine | 12.5 g |
| Chemlink 176 available from Ware Chemical Co. trimethylol propane ethoxylate triacryate | 15 g |
| Pentaerythritol triacrylate | 15 g |
| PVP K-90 (polyvinyl pyrrolidone) | 4 g |
| Benzophenone | 4 g |
| Michler's ketone | 0.1 g |
| 3-mercapto-1H—1,2,4-triazole | 0.2 g |
| Diethylhydroxylamine | 0.05 g |
| HVT-45 green pigment | 3 g |

This composition was coated, sampled and tested as in Example 1. Excellent results were obtained for all samples in comparison with controls which did not contain hexamethoxymethylmelamine and acid binder.

This example further illustrates that an amphoteric binder can be included as a cobinder without adversely affecting the thermal curing of the present invention.

What is claimed is:

1. A storage stable photopolymerizable composition comprising polymeric acid binder, monomer and photoinitiator with said composition containing an aldehyde condensation resin precursor whereby said precursor forms a crosslinkable aldehyde condensation resin in the presence of the acid binder which has an acid number of at least 45 and a pKa value of at least 5 whereby said photopolymerizable composition can be laminated to a support and held for two weeks at 40° C. without any substantial amount of crosslinking, said pKa value measured in a 1:1 volume ratio of methanol to water.

2. The composition of claim 1 wherein the aldehyde resin precursor is a melamine, urea or benzoguanamine.

3. The composition of claim 1 wherein the acid binder is an acrylate polymer.

4. The composition of claim 1 which can be laminated to a support below 120° C. and be held for four weeks at 40° C. before being thermally cured to react the acid binder and precursor.

5. The composition of claim 1 wherein the acid binder comprises at least 25% of the total binder content.

6. The composition of claim 1 wherein polyvinyl pyrrolidone is present.

7. The composition of claim 1 wherein polyurethane is present.

8. The composition of claim 1 wherein the aldehyde resin precursor comprises 3 to 15 percent by weight of the composition.

9. The composition of claim 1 containing an acrylic acid binder and hexamethoxymethylmelamine.

10. The composition of claim 1 wherein the acid binder has an acid number of at least 55 and a pKa value of at least 5.5.

11. The composition of claim 1 wherein the acid binder has an acid number in the range of from 55 to 130.

12. The composition of claim 1 wherein the acid binder has a pKa value in the range of from 5.5 to 7.5.

13. The composition of claim 1 wherein the acid binder has an acid number in the range from 60 to 100 and a pKa value of 5.9 to 7.2.

14. The composition of claim 1 wherein an amphoteric polymer is present.

15. The composition of claim 1 which can be held for four weeks at 40° C. without any substantial amount of crosslinking.

* * * * *

REEXAMINATION CERTIFICATE (884th)
United States Patent [19]
Gervay

[11] B1 4,621,043

[45] Certificate Issued Jun. 28, 1988

[54] STORAGE STABLE PHOTOPOLYMERIZABLE COMPOSITION

[75] Inventor: Joseph E. Gervay, Red Bank, N.J.

[73] Assignee: E. I. Du Pont de Nemours and Company, Wilmington, Del.

Reexamination Request:
No. 90/001,254, Jun. 5, 1987

Reexamination Certificate for:
Patent No.: 4,621,043
Issued: Nov. 4, 1986
Appl. No.: 462,403
Filed: Jan. 31, 1983

[51] Int. Cl.⁴ .................................................. G03C 1/68
[52] U.S. Cl. ................................................ 430/281; 430/910
[58] Field of Search .............................. 430/281, 910

[56] References Cited
U.S. PATENT DOCUMENTS

| | | | |
|---|---|---|---|
| 4,140,605 | 2/1979 | Sano et al. | 204/159 |
| 4,409,077 | 10/1983 | Sakiyama et al. | 204/159 |
| 4,438,189 | 3/1984 | Geissler et al. | 430/280 |

FOREIGN PATENT DOCUMENTS 7314873 10/1973 Japan .

*Primary Examiner*—Jack P. Brammer

[57] ABSTRACT

A storage stable photopolymerizable composition is disclosed comprising polymeric acid binder with an acid number of at least 45 and a pKa value of at least 5, monomer, photoinitiator and an aldehyde resin precursor.

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-15 are cancelled.

* * * * *